(12) United States Patent
Haller

(10) Patent No.: US 7,419,871 B2
(45) Date of Patent: Sep. 2, 2008

(54) METHODS OF FORMING SEMICONDUCTOR CONSTRUCTIONS

(75) Inventor: Gordon A. Haller, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 162 days.

(21) Appl. No.: 11/411,490

(22) Filed: Apr. 25, 2006

(65) Prior Publication Data

US 2007/0246803 A1    Oct. 25, 2007

(51) Int. Cl.
*H01L 21/8242* (2006.01)
(52) U.S. Cl. .............................. 438/242; 257/E21.655; 257/296; 257/300; 257/330; 257/401
(58) Field of Classification Search ................. 438/242; 257/E21.655
See application file for complete search history.

(56) References Cited

U.S. PATENT DOCUMENTS

2002/0011619 A1* 1/2002 Ohkawa ..................... 257/306
2006/0270153 A1* 11/2006 Lee ............................. 438/253

* cited by examiner

*Primary Examiner*—Tu-Tu V Ho
(74) *Attorney, Agent, or Firm*—Wells St. John P.S.

(57) ABSTRACT

The invention includes a method in which a semiconductor substrate is provided to have a memory array region, and a peripheral region outward of the memory array region. Paired transistors are formed within the memory array region, with such paired transistors sharing a source/drain region corresponding to a bitline contact location, and having other source/drain regions corresponding to capacitor contact locations. A peripheral transistor gate is formed over the peripheral region. Electrically insulative material is formed over the peripheral transistor gate, and also over the bitline contact location. The insulative material is patterned to form sidewall spacers along sidewalls of the peripheral transistor gate, and to form a protective block over the bitline contact location. Subsequently, capacitors are formed which extend over the protective block, and which electrically connect with the capacitor contact locations. The invention also includes semiconductor constructions.

18 Claims, 19 Drawing Sheets

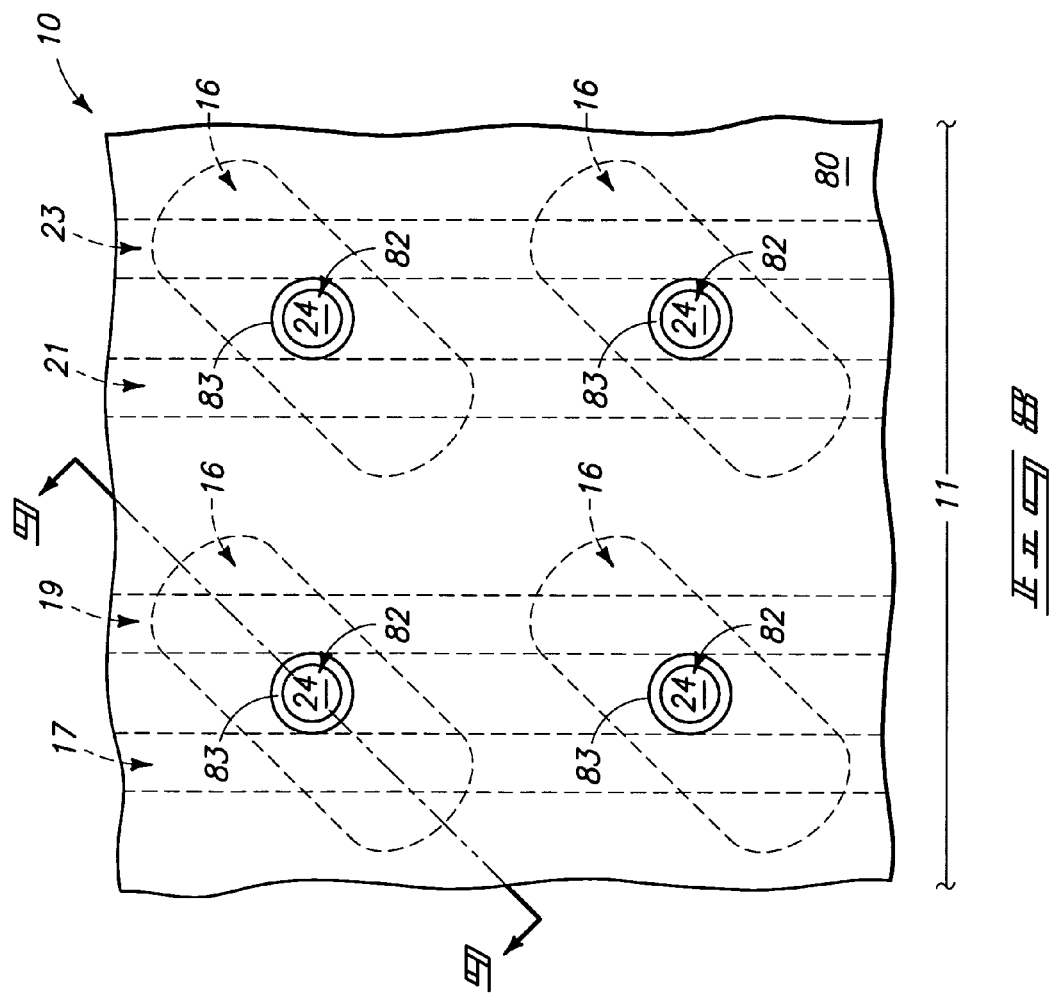

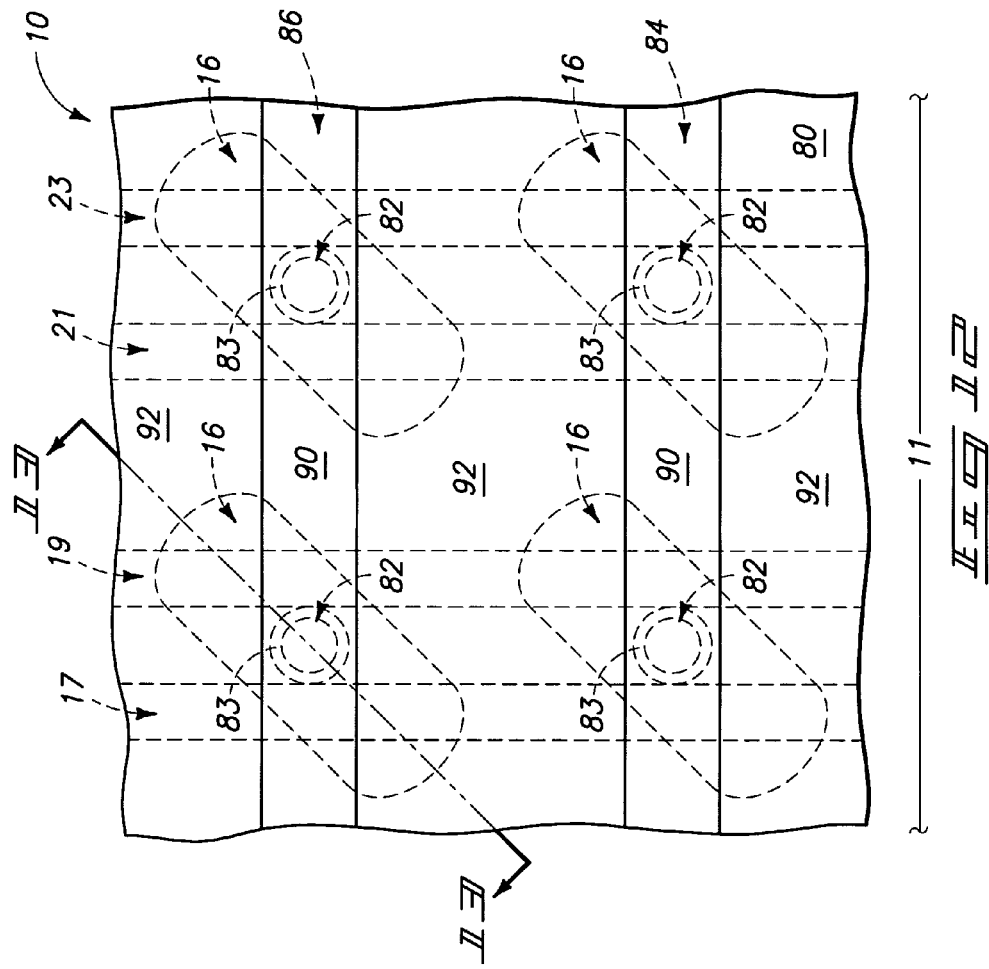

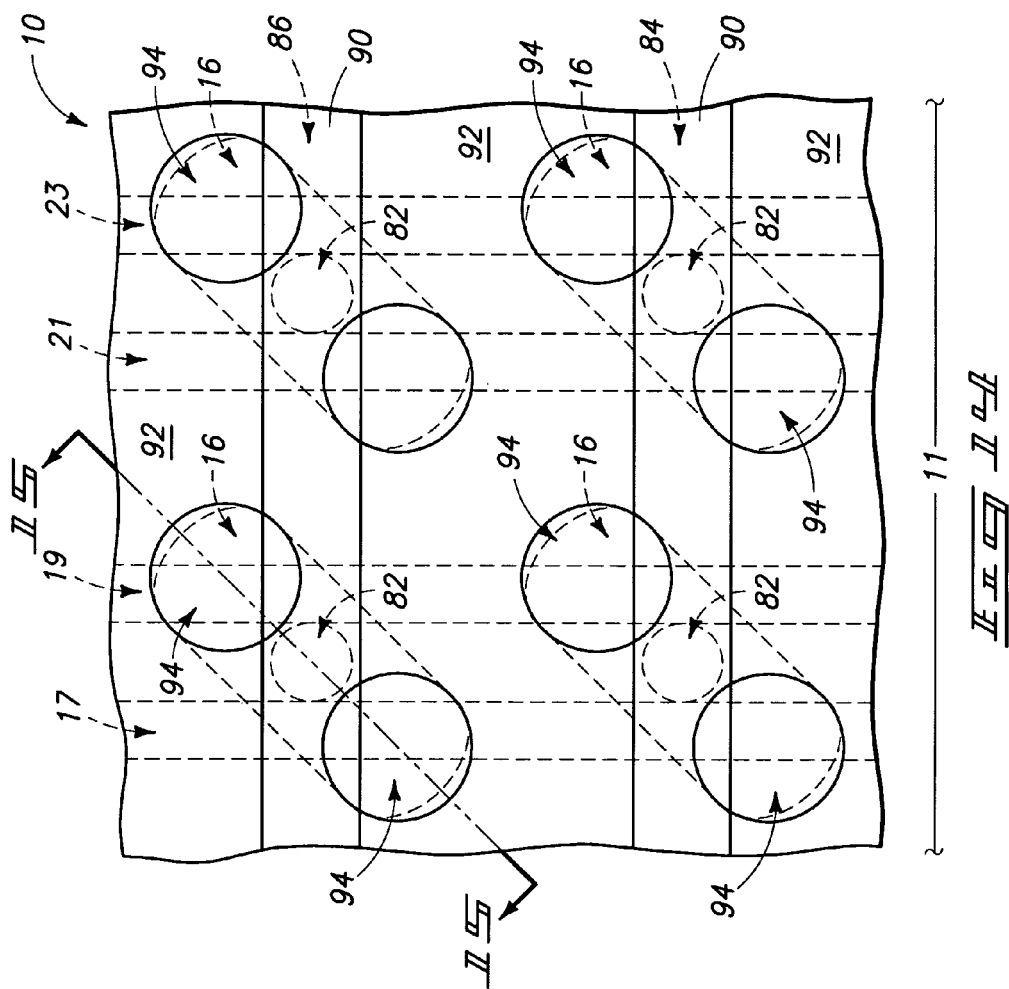

METHODS OF FORMING SEMICONDUCTOR CONSTRUCTIONS

TECHNICAL FIELD

The invention pertains to semiconductor constructions, and to methods of forming semiconductor constructions.

BACKGROUND OF THE INVENTION

A continuing goal of integrated circuit fabrication is to increase the number of devices within a given amount of semiconductor real estate (in other words, to increase the level of integration). Electrical shorting between adjacent regions becomes increasingly problematic with increasing levels of integration. Accordingly, it is desired to develop new methods for creating highly integrated devices.

BRIEF DESCRIPTION OF THE DRAWINGS

Preferred embodiments of the invention are described below with reference to the following accompanying drawings.

FIGS. 6 and 7 are a diagrammatic top view and a cross-sectional side view of the fragments of FIG. 1 shown at a processing stage subsequent to that of FIGS. 4 and 5. The cross-sections of FIG. 7 are along the lines 7-7 of FIG. 6.

FIGS. 8 and 9 are a diagrammatic top view and a cross-sectional side view of the fragment of the memory array region of FIG. 1 shown at a processing stage subsequent to that of FIGS. 6 and 7. The cross-section of FIG. 9 is along the line 9-9 of FIG. 8.

FIGS. 12 and 13 are a diagrammatic top view and a cross-sectional side view of the fragment of the memory array region of FIG. 1 shown at a processing stage subsequent to that of FIGS. 10 and 11. The cross-section of FIG. 13 is along the line 13-13 of FIG. 12.

FIGS. 14 and 15 are a diagrammatic top view and a cross-sectional side view of the fragment of the memory array region of FIG. 1 shown at a processing stage subsequent to that of FIGS. 12 and 13. The cross-section of FIG. 15 is along the line 15-15 of FIG. 14.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

An aspect of the invention pertains to methods for protecting conductive material associated with a bitline interconnect during fabrication of capacitors of a dynamic random access memory (DRAM) array. Such aspect can be applied to fabrication of highly integrated circuitry, such as, for example, $4.5F^2$ memory bits. An exemplary aspect of the invention is described with reference to FIGS. 1-17.

Figure 1:
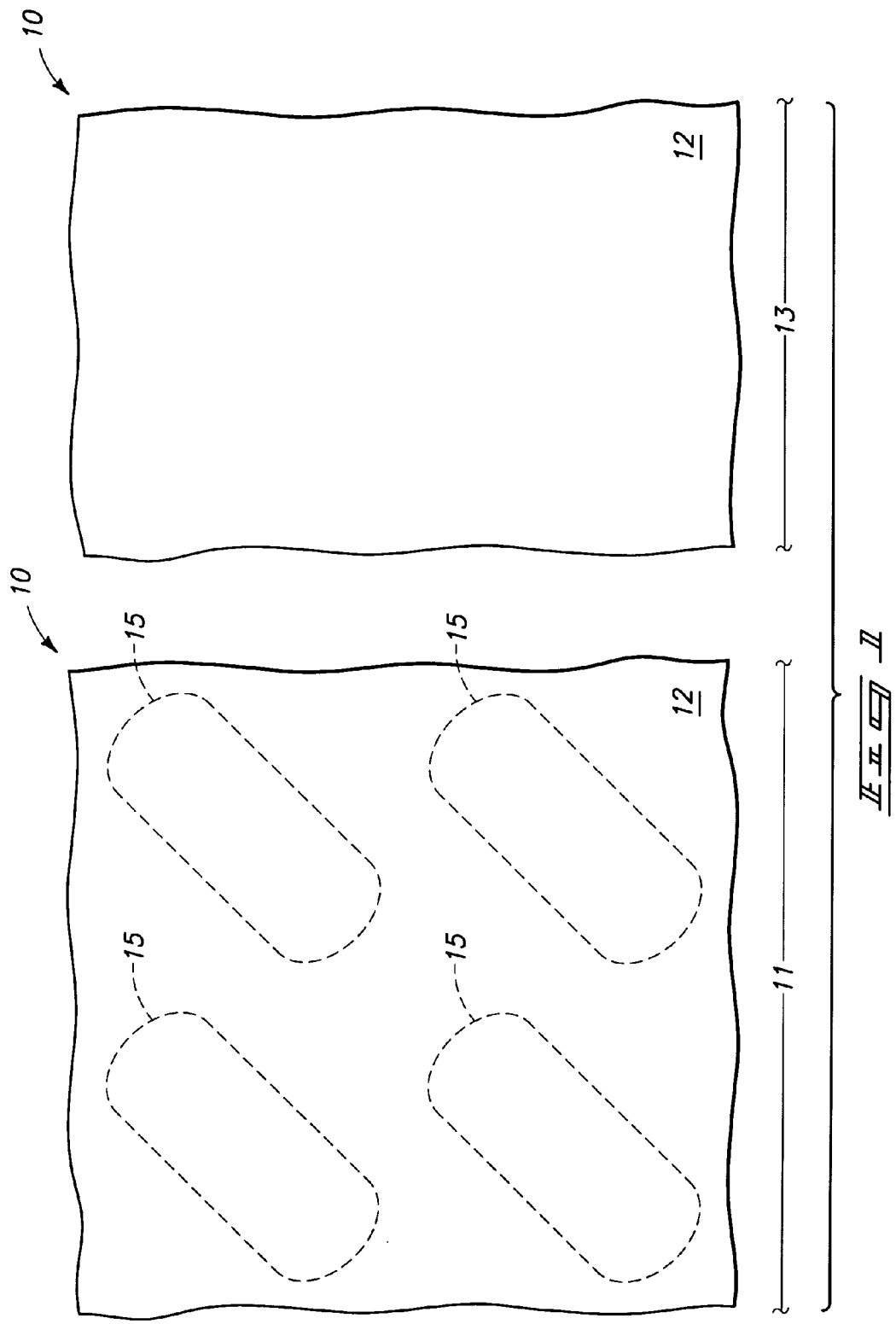
FIG. 1 is a diagrammatic top view of a pair of fragments of a semiconductor construction at a preliminary processing stage. One of the fragments is from a memory array region, and the other is from a region peripheral to the memory array region.

Referring initially to FIG. 1, a semiconductor construction 10 is illustrated in top view. The construction comprises a memory array region 11 and a region 13 peripheral to the memory array region. Regions 11 and 13 will both be part of the same semiconductor wafer (or part of the same semiconductor die), with peripheral region 13 being laterally outward (or outside of) of memory array region 11. Peripheral region 13 can, for example, ultimately comprise logic circuitry utilized for addressing memory cells associated with memory array region 11.

The construction 10 comprises a semiconductor base 12 which extends across the memory array region 11 and peripheral region 13. The base can comprise any suitable semiconductor material, and in particular aspects can comprise monocrystalline silicon lightly background doped with appropriate p-type dopant. The base can be part of a semiconductor substrate. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A plurality of active area locations 15 are diagrammatically illustrated in the memory array region. Access transistors will ultimately be formed within such active area locations.

Figure 2:
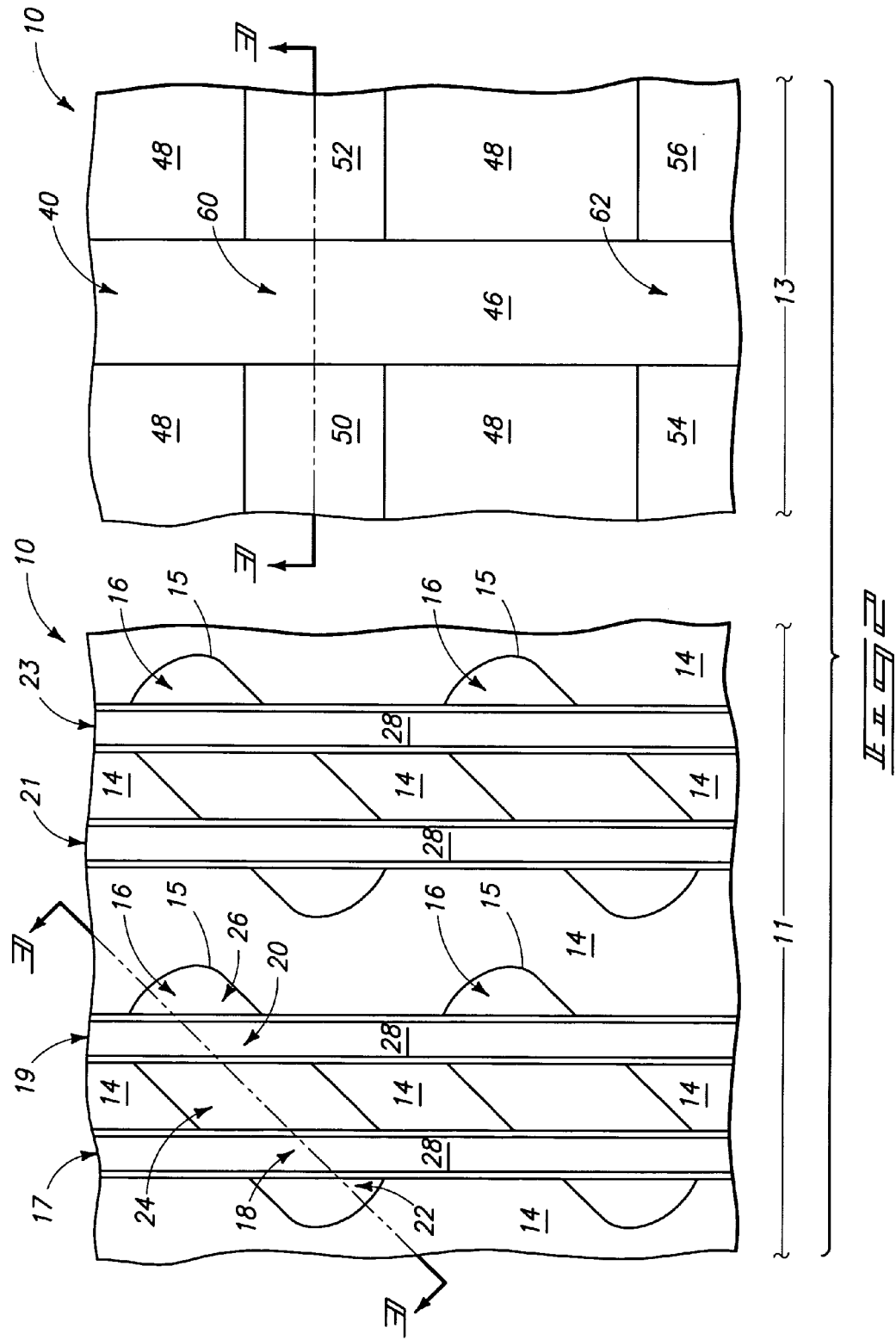
FIGS. 2 and 3 are a diagrammatic top view and a cross-sectional side view of the fragments of FIG. 1 shown at a processing stage subsequent to that of FIG. 1. The cross-sections of FIG. 3 are along the lines 3-3 of FIG. 2.
Figure 3:
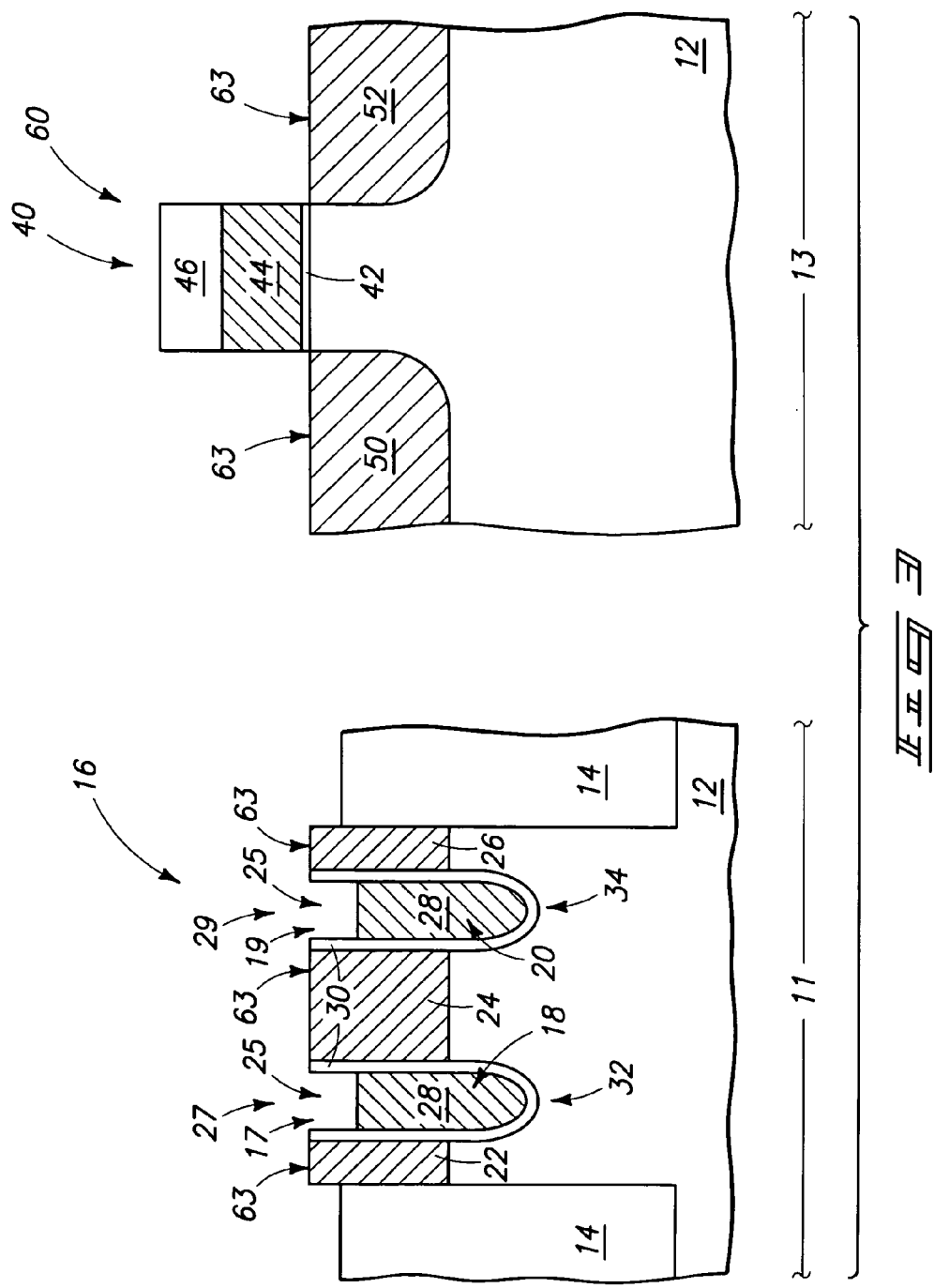

Referring next to FIGS. 2 and 3, construction 10 is illustrated after a number of structures are formed across semiconductor base 12. Among such structures are isolation regions 14 which extend into the base around the active area locations 15 of the memory area region 11. The semiconductor material remaining within the active area locations forms active areas 16. Although the active areas shown to be elliptical in the top view of FIG. 2, persons of ordinary skill in the art will recognize that the active areas can have numerous other suitable geometries.

Isolation regions 14 can comprise any suitable electrically insulative composition or combination of compositions formed within trenches extending into semiconductor base 12. For instance, the isolation regions can comprise, consist essentially of, or consist of silicon dioxide formed within trenches extending into base 12, and can, in some aspects, correspond to shallow trench isolation regions. The electrically insulative material of the isolation regions can be substantially homogeneous (as shown), or can comprise multiple layers.

FIG. 2 shows that a plurality of wordlines 17, 19, 21 and 23 extend across the memory array region 11. Pairs of the wordlines extend across each of the active areas 16. The wordlines comprise electrically conductive gate material 28.

Conductive gate material 28 can comprise any suitable composition or combination of compositions, including, for example, various metals, metal compositions, and/or conductively-doped semiconductor materials. The conductive gate material can be homogeneous (as shown), or can comprise multiple layers.

The cross-sectional view of FIG. 3 shows that the wordlines are recessed within the semiconductor material of base 12 in the memory array region. Specifically, the wordlines are within trenches extending across the memory array region. In the shown aspect of the invention, the trenches are lined with dielectric material 30; and the wordlines are recessed within the lined trenches to leave gaps 25 above the wordlines within the trenches.

The gate dielectric material 30 can comprise any suitable composition or combination of compositions, including, for example, silicon dioxide.

The conductive gate material comprises transistor gates within the active areas 16, with exemplary gates being shown as gates 18 and 20 in the cross-section of FIG. 3 (the gates 18 and 20 can be referred to as first and second gates, respectively). Source/drain regions 22, 24 and 26 are formed within base 12 adjacent the transistor gates (the source/drain regions 22, 24 and 26 can be referred to as first, second and third source/drain regions, respectively).

The source/drain regions 22, 24 and 26; together with the transistor gates 18 and 20, form a pair of transistors 27 and 29 which ultimately correspond to recessed access devices (RADs). Specifically, the transistors are ultimately utilized for accessing capacitors of a memory array, as is discussed below with reference to FIGS. 16 and 17. The RADs can be referred to as access transistors. The access transistors 27 and 29 can be considered to be paired transistors in that they share a source/drain region (specifically, region 24).

The source/drain regions 22, 24 and 26 of FIGS. 2 and 3 are conductively-doped diffusion regions extending into semiconductor material of base 12. Each of the transistor gates 18 and 20 gatedly connects two of the source/drain regions through a channel region beneath the gate. Specifically, gate 18 gatedly connects source/drain regions 22 and 24 through a channel region 32, and gate 20 gatedly connects source/drain regions 24 and 26 through a channel region 34. The channel regions can be appropriately doped with a threshold voltage implant.

FIGS. 2 and 3 also show a line 40 extending across peripheral region 13. The line 40 comprises a stack containing gate dielectric 42, electrically conductive material 44, and electrically insulative capping material 46. Gate dielectric material 42 can comprise any suitable composition or combination of compositions, such as, for example, silicon dioxide; and can be homogeneous (as shown) or can comprise multiple layers. Electrically conductive material 44 can comprise any suitable composition or combination of compositions, such as, for example, metal, metal-containing compounds, and/or conductively-doped semiconductor materials; and can be homogeneous (as shown) or can comprise multiple layers. Capping material 46 can comprise any suitable composition or combination of compositions, such as, for example, silicon nitride; and can be homogeneous (as shown), or can comprise multiple layers.

Source/drain regions 50, 52, 54 and 56 are shown formed within substrate 12 adjacent segments of line 40. Such source/drain regions can be formed with any suitable implant of n-type dopant and/or p-type dopant to conductively dope semiconductor material of base 12. Source/drain regions along the line 40 are spaced from one another by isolation regions 48. Such isolation regions can, for example, correspond to shallow trench isolation regions comprising silicon dioxide.

The line 40 and source/drain regions proximate thereto form peripheral transistors 60 and 62; with the peripheral transistor 60 being illustrated in the cross-section of FIG. 3.

In some aspects, semiconductor base 12 can be considered to comprise an uppermost surface 63 extending across memory array region 11 and peripheral region 13. Such uppermost surface can be an uppermost surface of semiconductor material, such as, for example, an uppermost surface of monocrystalline silicon. The transistor gates of the RADs associated with memory array region 11 are recessed into such uppermost surface, while the gates associated with peripheral region 13 are entirely over such uppermost surface. The uppermost surface of base 12 within region 11 can be referred to as a first uppermost semiconductor surface, and the uppermost surface of base 12 within region 13 can be referred to as a second uppermost semiconductor surface. Such first and second uppermost semiconductor surfaces can be substantially coplanar (i.e., co-elevational) with one another.

The construction of FIGS. 2 and 3 can be formed with any suitable processing.

Figure 4:
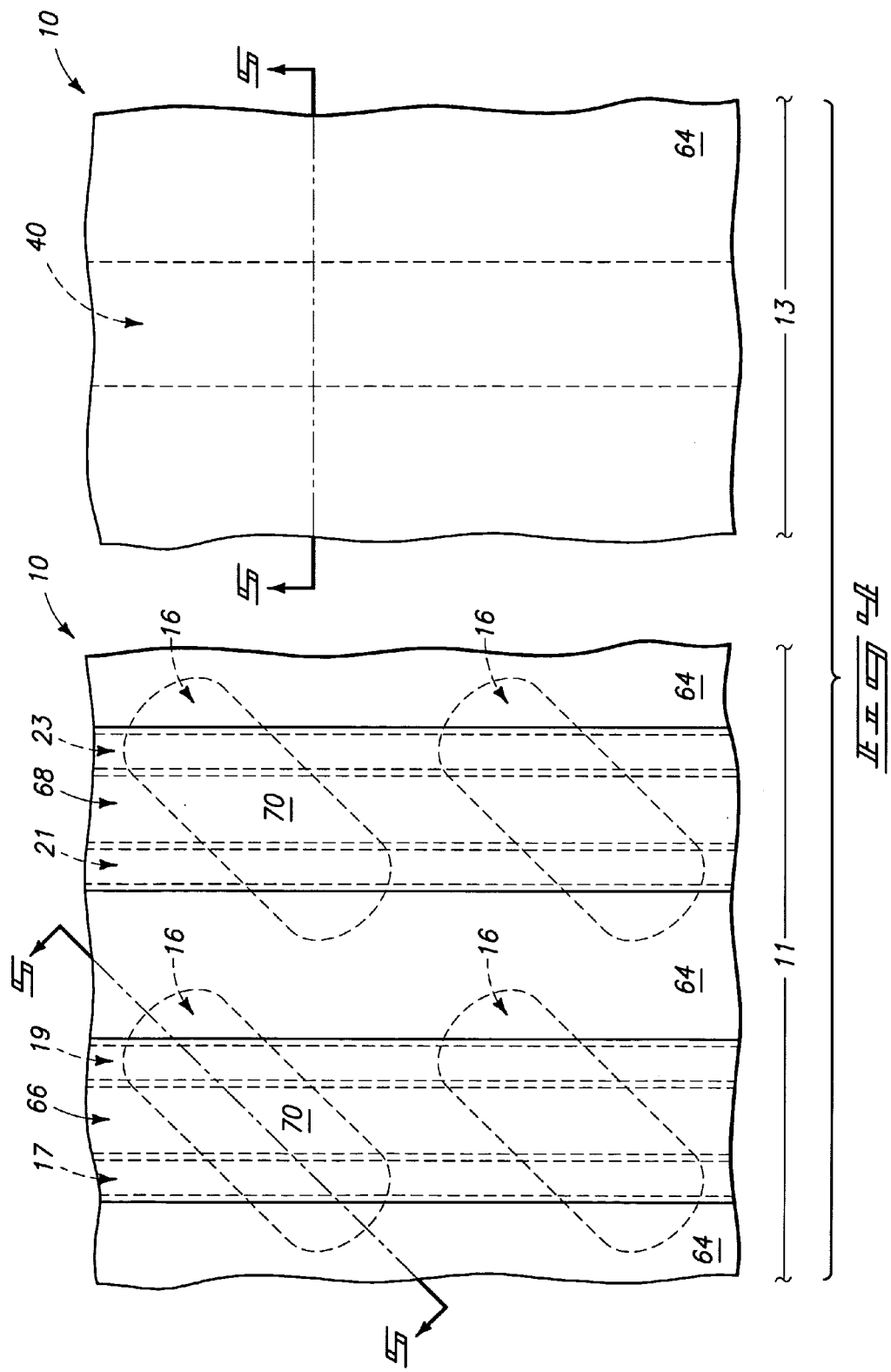
FIGS. 4 and 5 are a diagrammatic top view and a cross-sectional side view of the fragments of FIG. 1 shown at a processing stage subsequent to that of FIGS. 2 and 3. The cross-sections of FIG. 5 are along the lines 5-5 of FIG. 4.
Figure 5:
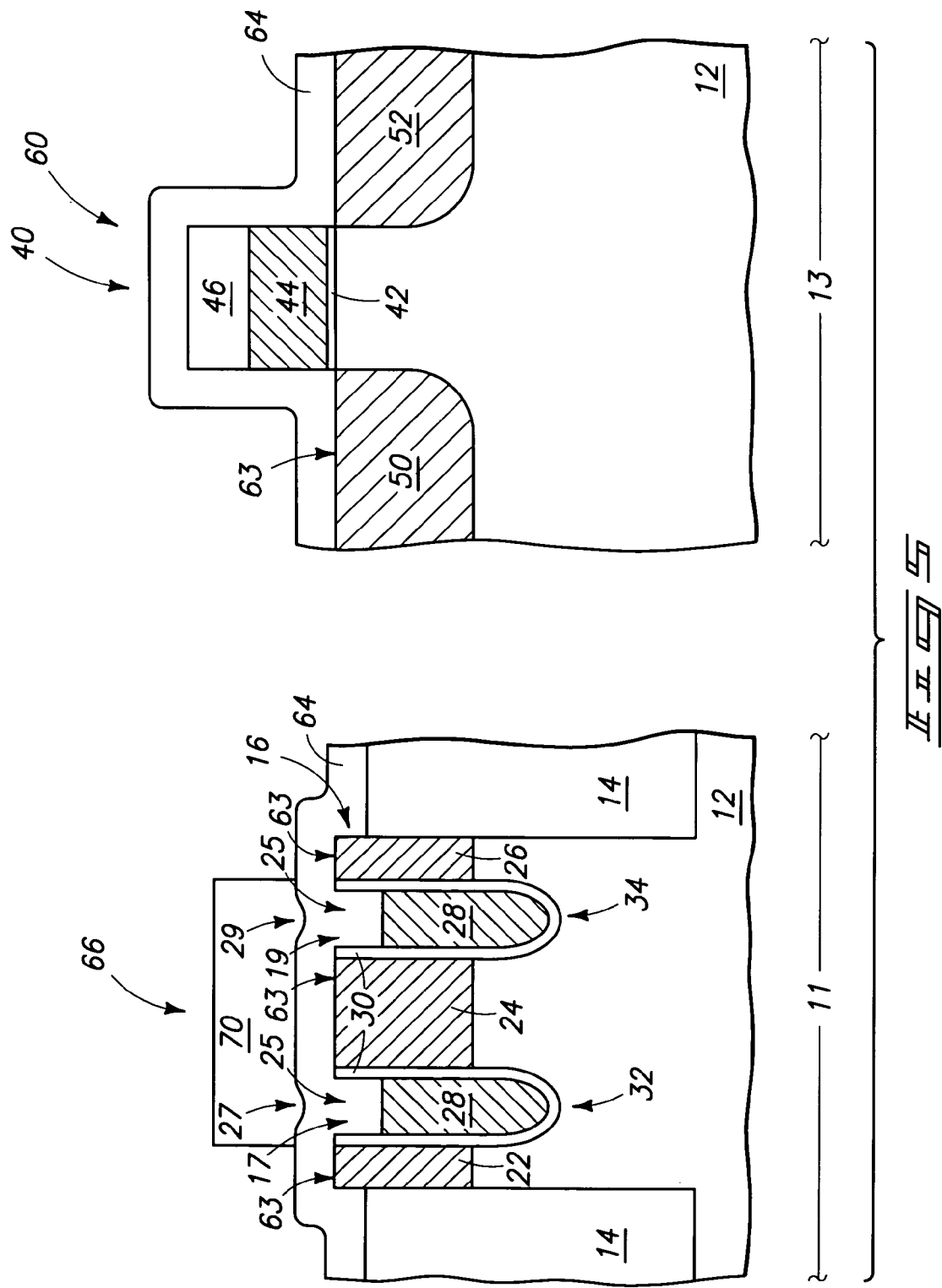

Referring to FIGS. 4 and 5, an electrically insulative layer 64 is formed to extend over memory array region 11 and peripheral region 13. The layer 64 extends over active areas 16 of the memory array region, as well as over line 40 of the peripheral region. Insulative material 64 can comprise any suitable composition or combination of compositions, and in particular aspects will comprise, consist essentially of, consist of silicon nitride. The insulative material can be homogeneous (as shown) or can comprise multiple layers. In the shown aspect of the invention, the insulative material 64 substantially fills the gaps 25 over the recessed wordlines of the memory array region, as shown in FIG. 5.

Stripes 66 and 68 of patterned masking material 70 extend along and over the wordlines 17, 19, 21 and 23 of the memory array region 11; with individual stripes covering pairs of the wordlines (for instance, stripe 66 covers wordlines 17 and 19). The masking material 70 can comprise any suitable composition, and in some aspects can correspond to photolithographically patterned photoresist.

Figure 6:
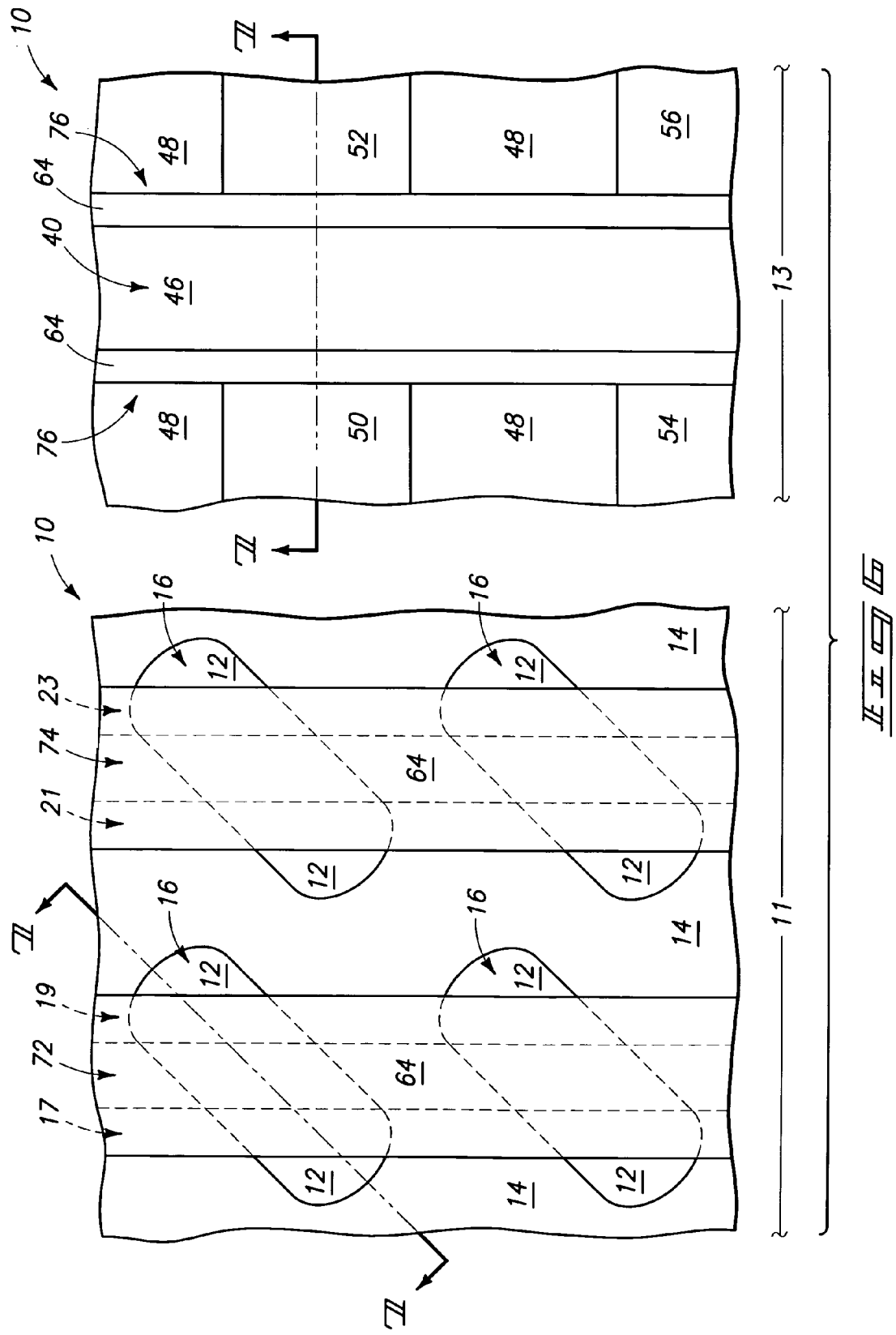

Referring to FIGS. 6 and 7, insulative material 64 is etched to transfer the stripe pattern of masking material 70 (FIGS. 4 and 5) into material 64 over memory array region 11, and to thereby form material 64 into a pair of stripes 72 and 74. Subsequently, masking material 70 is removed.

The stripes of material 64 over the memory array region each cover at least portions of two wordlines, with stripe 72 covering wordlines 17 and 19; and stripe 74 covering wordlines 21 and 23. The stripes of material 64 protect an upper surface of region 24 during subsequent processing.

The etch utilized to pattern material 64 is an anisotropic etch, and accordingly such etch forms material 64 into sidewall spacers along sidewalls of line 40 over the peripheral region 13.

Figure 9:
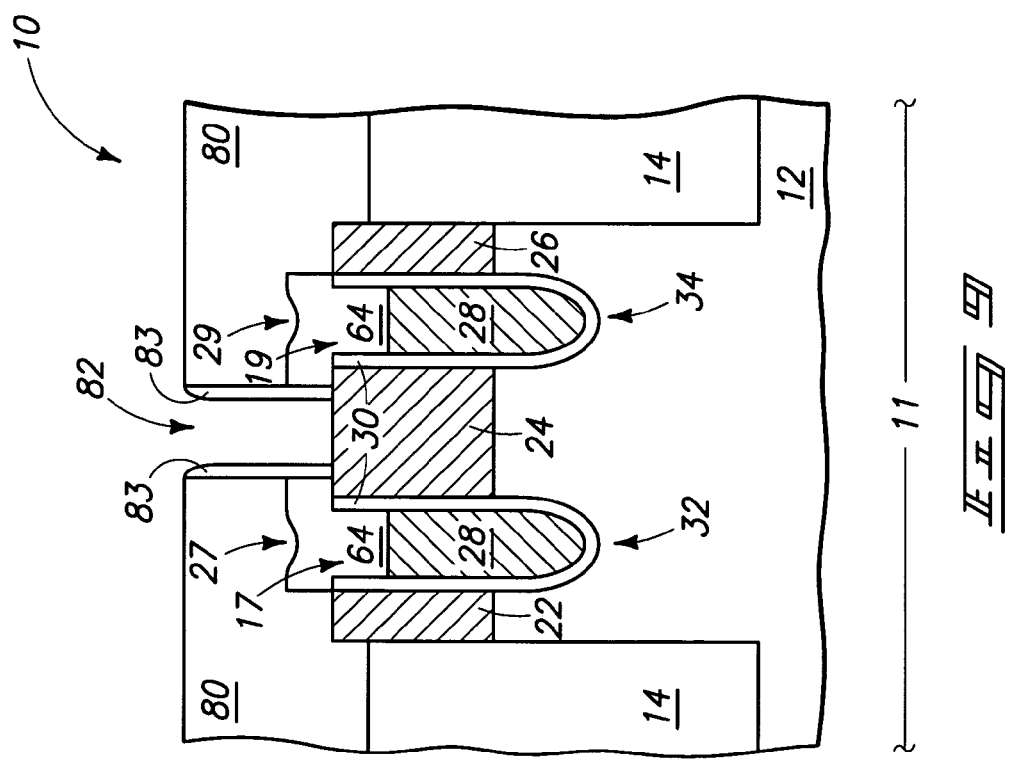

Referring next to FIGS. 8 and 9, electrically insulative material 80 is formed over construction 10, and openings 82 are formed through the electrically insulative material to shared source/drain regions 24 of the memory array. The electrically insulative material 80 can comprise any suitable composition or combination of compositions, and in particular aspects can comprise one or more of silicon dioxide, silicon nitride, and various doped glasses (such as, for example, borophosphosilicate glass (BPSG), phosphosilicate glass (PSG), etc.). The insulative material 80 can be homogeneous (as shown) or can comprise a plurality of layers of differing composition relative to one another.

The openings 82 can be formed with any suitable processing, including, for example, utilization of a photolithographically patterned mask (not shown) to define locations of the openings; formation of the openings in the defined locations with one or more suitable etches; and subsequent removal of the mask.

Spacers of insulative material 83 are shown formed within openings 82. Such spacers can, for example, comprise, consist essentially of, or consist of silicon nitride. The spacers can be formed by providing a layer of material 83 across an upper surface of construction 10 and within the openings 82, and then subjecting the layer to an anisotropic etch.

The peripheral region 13 (FIGS. 6 and 7) is not shown in FIGS. 8 and 9, as the remainder of the processing associated with the peripheral region can be conventional.

Figure 11:
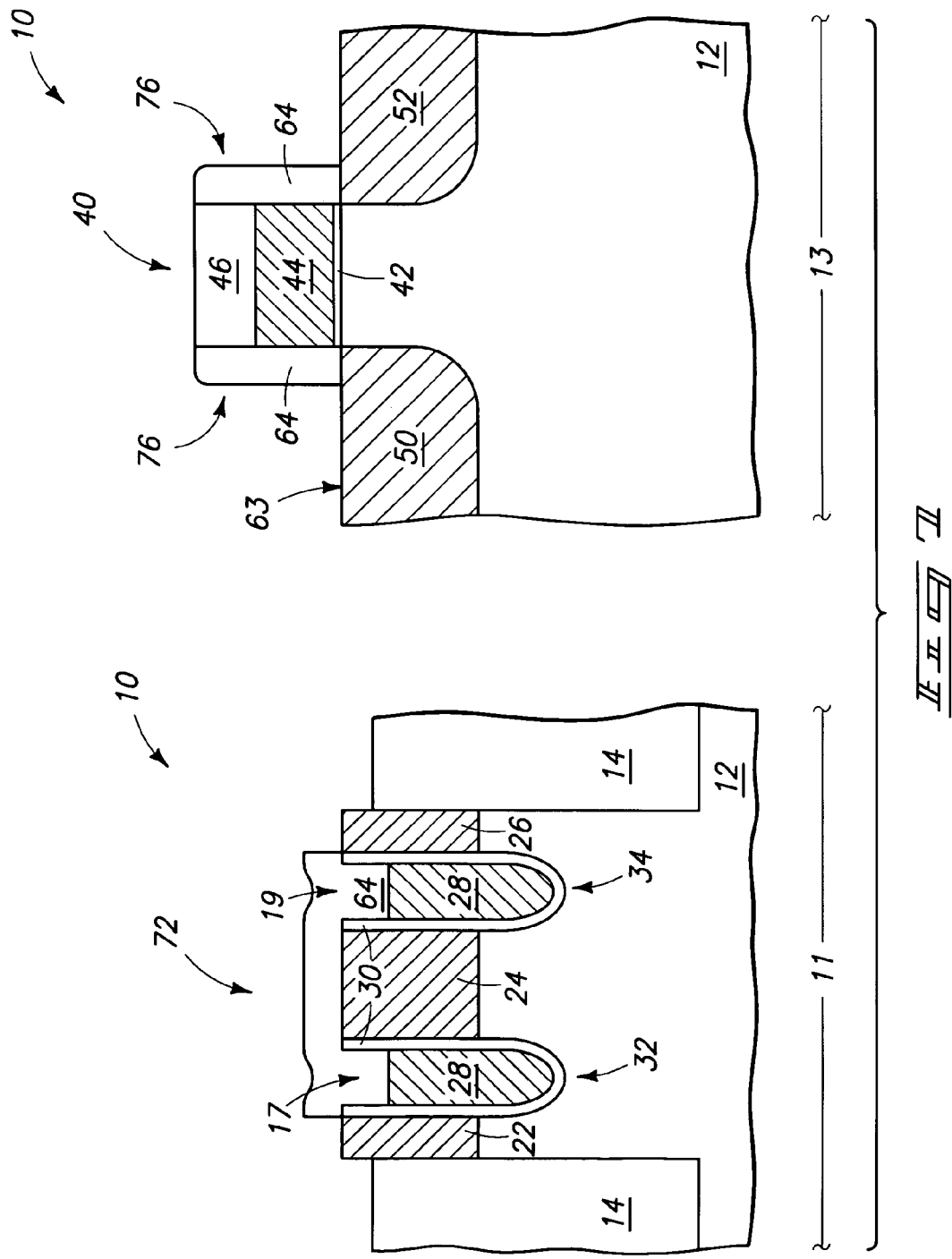
FIGS. 10 and 11 are a diagrammatic top view and a cross-sectional side view of the fragment of the memory array region of FIG. 1 shown at a processing stage subsequent to that of FIGS. 8 and 9. The cross-section of FIG. 11 is along the line 11-11 of FIG. 10.
Figure 10:
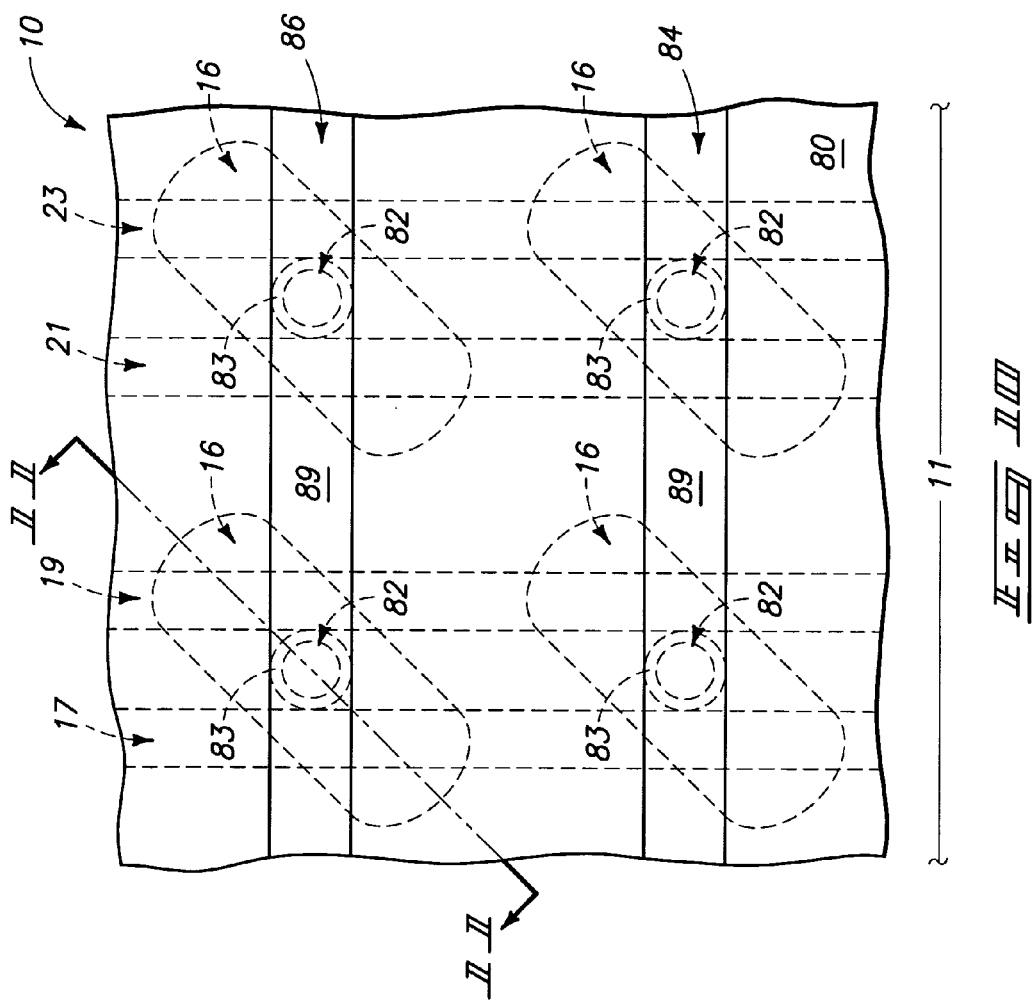
Figure 11:
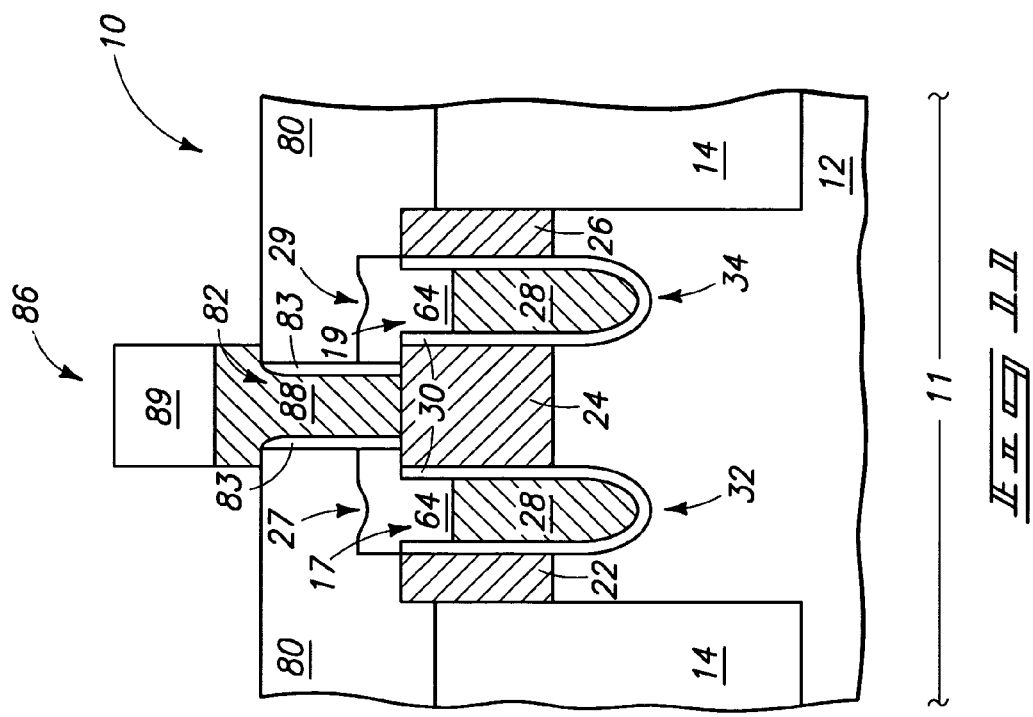
Figure 11:
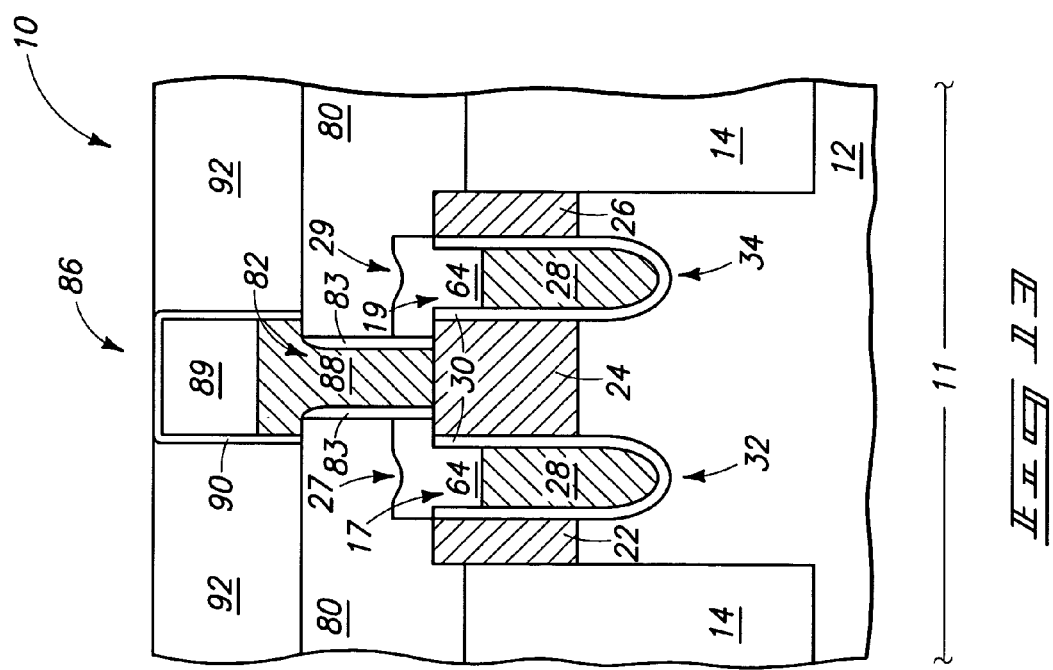

Referring next to FIGS. 10 and 11, lines 84 and 86 of bitline stacks are formed across memory array region 11. The bitline stacks comprise conductive bitlines 88; which can comprise any suitable composition or combination of compositions, including, for example, various metals, metal compounds, and/or conductively-doped semiconductor materials. The bitlines can comprise multiple layers, or can be homogeneous (as shown). The bitline stacks also comprise insulative capping material 89, which can, for example, comprise, consist essentially of, or consist of silicon nitride.

The bitline stacks can be patterned into the shown lines 84 and 86 with any suitable methodology. For instance, a stack of the bitline material and capping material can be formed across an entirety of construction 10; a protective mask (such as a photoresist mask) formed over regions of such stacks that are to remain as lines 84 and 86; unprotected regions of the stacks removed; and finally the protective mask removed to leave the shown lines 84 and 86.

The conductive bitline material of the bitline stacks makes electrical interconnect with the shared source/drain regions of the active areas (for instance, the shared source/drain region 24 of FIG. 11) through conductive interconnects extending within openings 82. Such conductive interconnects can be provided within the openings during fabrication of the bitline stacks; or can be formed within the openings prior to fabrication of the bitline stacks. Although the conductive interconnects extending within the openings are shown being formed of the same material as the conductive bitline material, it is to be understood that the invention also includes aspects in which the conductive interconnects within openings 82 comprise different materials than the conductive bitline material.

Referring next to FIGS. 12 and 13, electrically insulative shells of material 90 are formed over the bitline stacks and along sidewalls of the bitline stacks. Insulative material 90 can comprise any suitable composition or combination of compositions, and in particular aspects will comprise, consist essentially of, consist of silicon nitride. Material 90 can be patterned into the shown shells by: initially providing material 90 to cover an entirety of construction 10; utilization of a photolithographically patterned mask (not shown) to define locations of the shells; etching of material 90 not protected by the mask with one or more suitable etches; and subsequent removal of the mask. Accordingly, the patterning of material 90 into the shown shells encapsulating the bitline stacks can be accomplished with processing similar to that discussed above with reference to FIGS. 4-7 for forming the stripes of insulative material 64. In some aspects, the etching of material 90 can be accomplished with an anisotropic etch during simultaneous formation of sidewall spacers from material 90 over a peripheral region of construction 10, similar to the fabrication of spacers from material 64 discussed above. The formation of spacers from material 90 can done alternatively, or additionally, to the fabrication of spacers from material 64.

After formation of the insulative shells of material 90, insulative material 92 is deposited. Insulative material 92 can comprise any suitable composition or combination of compositions, and in particular aspects can comprise one or more of silicon dioxide, silicon nitride, and various doped glasses (such as, for example, borophosphosilicate glass (BPSG), phosphosilicate glass (PSG), etc.). The insulative material 92 can be homogeneous (as shown) or can comprise a plurality of layers of differing composition relative to one another. In some aspects, the materials 80 and 92 can be homogenous and the same composition as one another, so that the materials merge to form a single homogenous electrically insulative mass. In the shown aspect of the invention, materials 90 and 92 together form a substantially planar upper surface.

Figure 15:
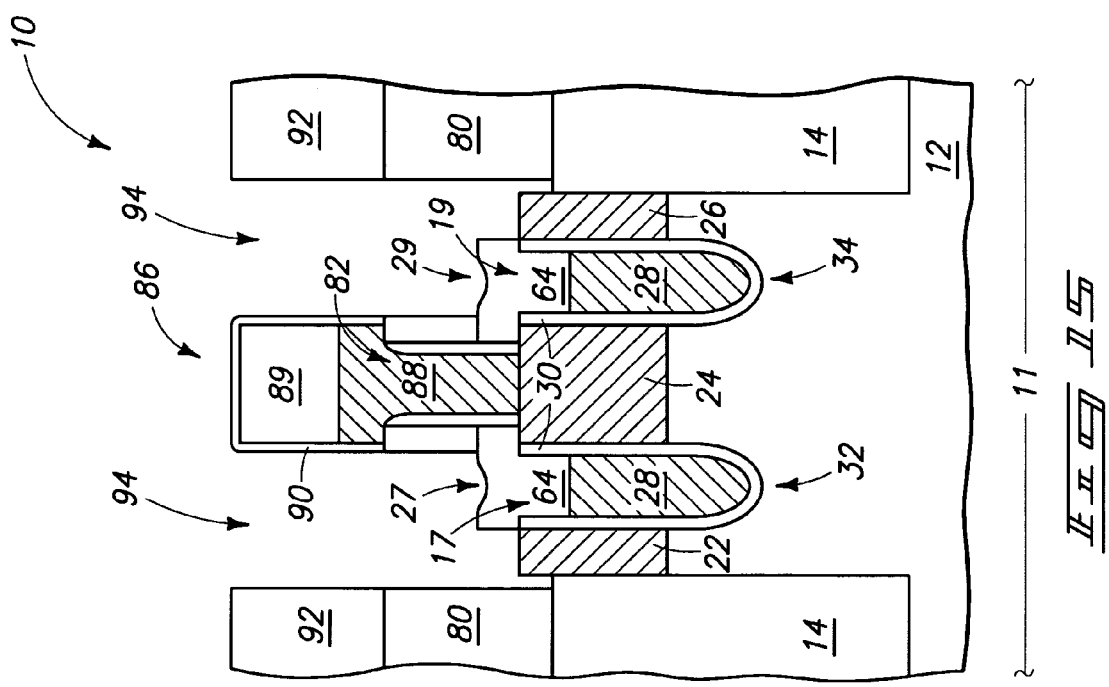

Referring to FIGS. 14 and 15, openings 94 are formed through the electrically insulative materials 80 and 92 to unshared source/drain regions of the active areas (for instance, the source/drain regions 22 and 26 shown in the cross-sectional view of FIG. 15).

Openings 94 can be formed with any suitable processing, including, for example, utilization of a photolithographically patterned mask (not shown) to define locations of the openings; formation of the openings in the defined locations with one or more suitable etches; and subsequent removal of the mask. The etching utilized to form openings 94 is preferably anisotropic etching selective for materials 80 and 92 relative to materials 64 and 90; and thus the etching does not penetrate through materials 64 and 90 to expose the bitlines or the shared source/drain regions. In particulars aspects, materials 64 and 90 will consist of silicon nitride; materials 80 and 92 will consist of silicon dioxide or doped silicon dioxide; and the etch will be selective for silicon dioxide, or doped silicon dioxide, relative to silicon nitride. For purposes of interpreting this disclosure, an etch is to be understood as being selective for one material relative to another if the etch removes said one material at a faster rate than the other; which can include, but is not limited to, applications in which an etch is 100% selective for removal of a particular material.

Figure 16:
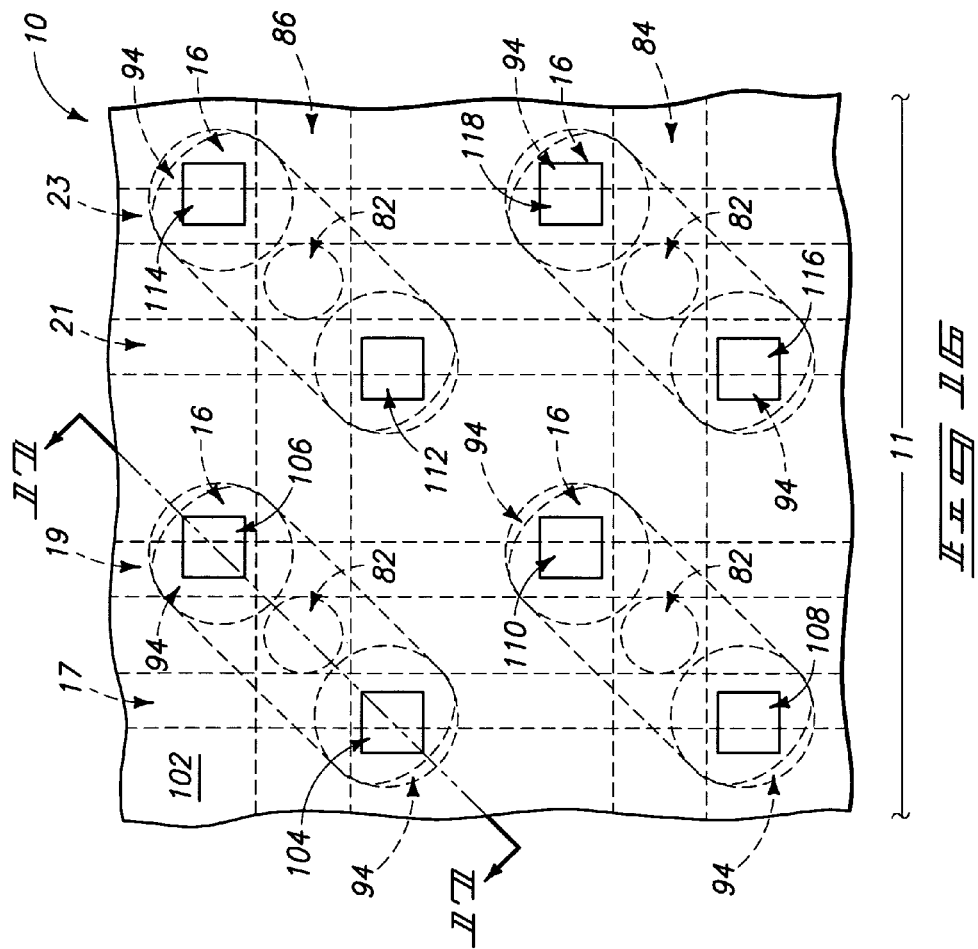
FIGS. 16 and 17 are a diagrammatic top view and a cross-sectional side view of the fragment of the memory array region of FIG. 1 shown at a processing stage subsequent to that of FIGS. 14 and 15. The cross-section of FIG. 17 is along the line 17-17 of FIG. 16.
Figure 17:
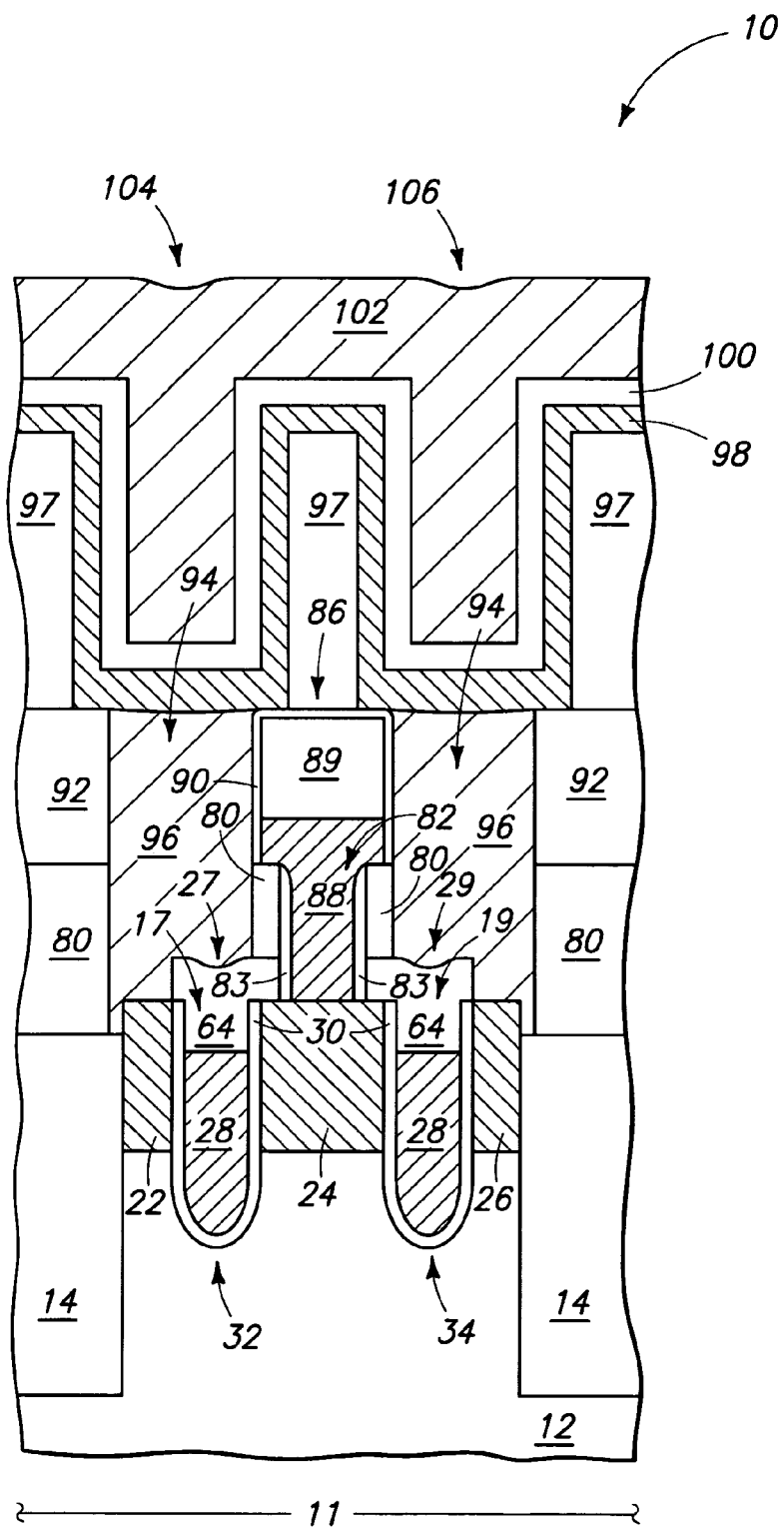

Referring to FIGS. 16 and 17, material 96 is formed within the openings; and materials 97, 98, 100 and 102 are formed across materials 90, 92 and 96 to form a plurality of capacitor constructions 104, 106, 108, 110, 112, 114, 116 and 118 (with the capacitors being diagrammatically identified by boxes in the top view of FIG. 16).

Material 96 is an electrically conductive material forming pedestals contacting outer (non-shared) source/drain regions of the active areas (for instance, source/drain regions 22 and 26 of the cross-sectional view of FIG. 17). Such material can comprise any suitable composition or combination of compositions, including, for example, various metals, metal compositions, and conductively-doped semiconductor materials. In some aspects, the pedestals of material 96 can be omitted. Material 97 is a thick insulative material, such as, for example, BPSG or PSG having a thickness of 2 microns or greater, and patterned to have capacitor container openings therein. Materials 98, 100 and 102 are a capacitor electrode material, capacitor dielectric material, and capacitor plate material, respectively. The capacitor electrode material and capacitor plate material can be the same in composition to one another, or different, and can comprise any suitable composition or combination of compositions, including, for example, various metals, metal compositions, and conductively-doped semiconductor materials. Dielectric material 100 can comprise any suitable composition or combination of compositions, including, for example, silicon dioxide, silicon nitride, and/or any of various high-k materials. One or more of the materials 96, 97, 98, 100 and 102 can comprise various layers, or all of the materials can be homogeneous (as shown).

The capacitor electrode material 98 and conductive material 96 can be considered to together be capacitor storage nodes. If material 96 is omitted, the electrode material 98 will itself be the capacitor storage node. In some aspects of the present invention, the capacitor storages nodes contact one or both of the insulative materials 64 and 90 provided to protect the shared source/drain regions and the bitlines.

Although the shown aspect of the invention utilizes container capacitors, it is to be understood that other types of capacitors can be utilized in other aspects of the invention.

The shown construction comprising capacitors joined to bitlines through transistor devices can be understood to correspond to an array of DRAM cells.

The constructions discussed above can be incorporated into various electronic systems. Exemplary systems are described with reference to FIGS. 18-21.

Figure 18:
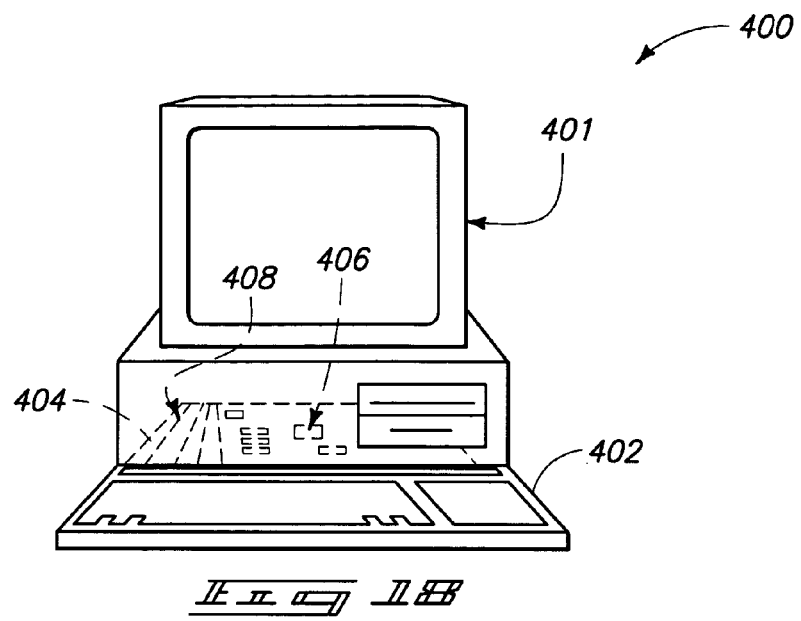
FIG. 18 is a diagrammatic view of a computer illustrating an exemplary application of the present invention.
Figure 19:
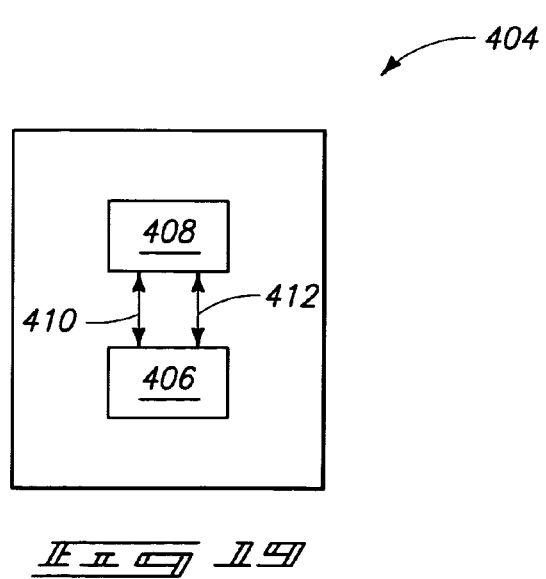
FIG. 19 is a block diagram showing particular features of the motherboard of the FIG. 18 computer.

FIG. 18 illustrates generally, by way of example but not by way of limitation, an embodiment of a computer system 400 according to an aspect of the present invention. Computer system 400 includes a monitor 401 or other communication output device, a keyboard 402 or other communication input device, and a motherboard 404. Motherboard 404 can carry a microprocessor 406 or other data processing unit, and at least one memory device 408. Memory device 408 can comprise various aspects of the invention described above. Memory device 408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 408 and processor 406. Such is illustrated in the block diagram of the motherboard 404 shown in FIG. 19. In such block diagram, the addressing circuitry is illustrated as 410 and the read circuitry is illustrated as 412. Various components of computer system 400, including processor 406, can comprise one or more of the memory constructions described previously in this disclosure.

Processor device 406 can correspond to a processor module, and associated memory utilized with the module can comprise teachings of the present invention.

Memory device 408 can correspond to a memory module. For example, single in-line memory modules (SIMMs) and dual in-line memory modules (DIMMs) may be used in the implementation which utilize the teachings of the present invention. The memory device can be incorporated into any of a variety of designs which provide different methods of reading from and writing to memory cells of the device. One such method is the page mode operation. Page mode operations in a DRAM are defined by the method of accessing a row of a memory cell arrays and randomly accessing different columns of the array. Data stored at the row and column intersection can be read and output while that column is accessed.

An alternate type of device is the extended data output (EDO) memory which allows data stored at a memory array address to be available as output after the addressed column has been closed. This memory can increase some communication speeds by allowing shorter access signals without reducing the time in which memory output data is available on a memory bus. Other alternative types of devices include SDRAM, DDR SDRAM, SLDRAM, VRAM and Direct RDRAM, as well as others such as SRAM or Flash memories.

Memory device 408 can comprise memory formed in accordance with one or more aspects of the present invention.

Figure 20:
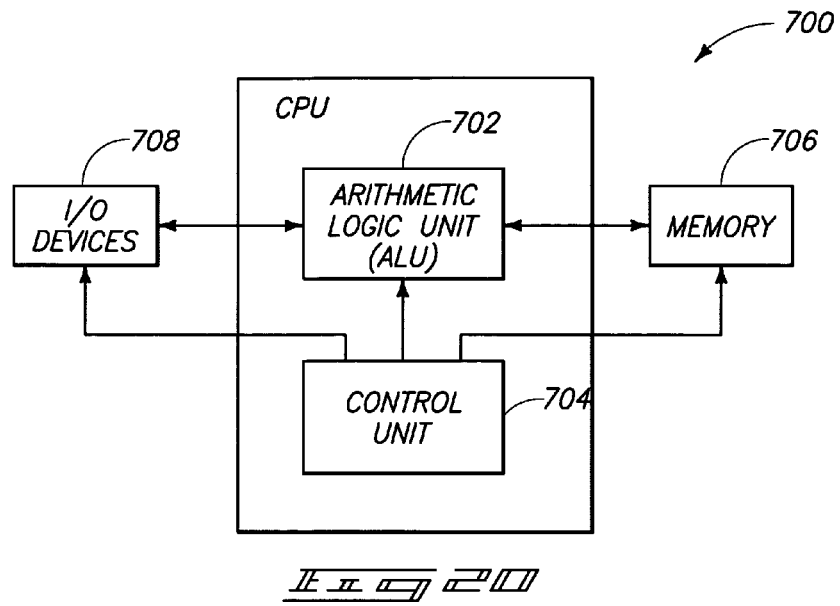
FIG. 20 is a high level block diagram of an electronic system according to an exemplary aspect of the present invention.

FIG. 20 illustrates a simplified block diagram of a high-level organization of various embodiments of an exemplary electronic system 700 of the present invention. System 700 can correspond to, for example, a computer system, a process control system, or any other system that employs a processor and associated memory. Electronic system 700 has functional elements, including a processor or arithmetic/logic unit (ALU) 702, a control unit 704, a memory device unit 706 and an input/output (I/O) device 708. Generally, electronic system 700 will have a native set of instructions that specify operations to be performed on data by the processor 702 and other interactions between the processor 702, the memory device unit 706 and the I/O devices 708. The control unit 704 coordinates all operations of the processor 702, the memory device 706 and the I/O devices 708 by continuously cycling through a set of operations that cause instructions to be fetched from the memory device 706 and executed. In various embodiments, the memory device 706 includes, but is not limited to, random access memory (RAM) devices, read-only memory (ROM) devices, and peripheral devices such as a floppy disk drive and a compact disk CD-ROM drive. One of ordinary skill in the art will understand, upon reading and comprehending this disclosure, that any of the illustrated electrical components are capable of being fabricated to include memory constructions in accordance with various aspects of the present invention.

Figure 21:
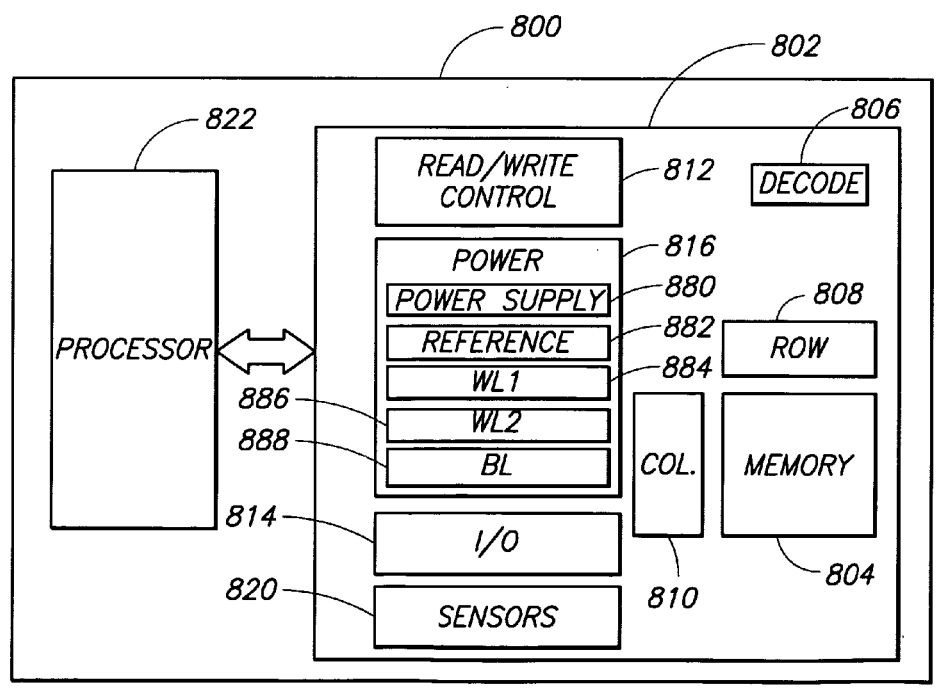
FIG. 21 is a simplified block diagram of an exemplary memory device according to an aspect of the present invention.

FIG. 21 is a simplified block diagram of a high-level organization of various embodiments of an exemplary electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing the first wordline with pulses, circuitry 886 for providing the second wordline with pulses, and circuitry 888 for providing the bitline with pulses. The system 800 also includes a processor 822, or memory controller for memory accessing.

The memory device 802 receives control signals from the processor 822 over wiring or metallization lines. The memory device 802 is used to store data which is accessed via I/O lines. It will be appreciated by those skilled in the alt that additional circuitry and control signals can be provided, and that the memory device 802 has been simplified to help focus on the invention. At least one of the processor 822 or memory device 802 can include a memory construction of the type described previously in this disclosure.

The various illustrated systems of this disclosure are intended to provide a general understanding of various applications for the circuitry and structures of the present invention, and are not intended to serve as a complete description of all the elements and features of an electronic system using memory cells in accordance with aspects of the present invention. One of the ordinary skill in the art will understand that the various electronic systems can be fabricated in single-package processing units, or even on a single semiconductor chip, in order to reduce the communication time between the processor and the memory device(s).

Applications for memory cells can include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a semiconductor construction, comprising:
   providing a semiconductor substrate having a memory array region and a region peripheral to the memory array region;
   forming paired transistors within the memory array region, the paired transistors sharing a source/drain region, and having two other source/drain regions in addition to the shared source/drain region;
   forming a peripheral transistor gate within the region peripheral to the memory array region;
   forming an electrically insulative layer extending over the shared source/drain region and over the peripheral transistor gate;
   patterning the electrically insulative layer into a protective block over the shared source/drain region and into sidewall spacers along the peripheral transistor gate; the patterning of the layer exposing said two other source/drain regions;
   forming a bitline in electrically connection with the shared source/drain region; and
   forming two capacitors in electrical connection with the two other source/drain regions.

2. The method of claim 1 wherein the capacitors are container capacitors.

3. The method of claim 2 wherein portions of the two capacitors are directly over portions of the protective block.

4. A method of forming a semiconductor construction, comprising:
   providing a semiconductor substrate having a memory array region and a region peripheral to the memory array region;
   forming paired transistors within the memory array region, the paired transistors sharing a source/drain region;
   forming a peripheral transistor gate within the region peripheral to the memory array region;
   forming an electrically insulative layer extending over the shared source/drain region and over the peripheral transistor gate;
   patterning the electrically insulative layer into a protective block over the shared source/drain region and into sidewall spacers along the peripheral transistor gate;
   wherein the shared source/drain region is a conductively-doped diffusion region within a semiconductor material; and
   wherein the paired transistors have gates recessed into said semiconductor material.

5. The method of claim 4 wherein the semiconductor material extends across the region peripheral to the memory region, and wherein the peripheral gate is entirely over the semiconductor material.

6. The method of claim 5 further comprising conductively-doping regions of the semiconductor material proximate the peripheral gate to form source/drain regions proximate the peripheral gate; the peripheral gate and source/drain regions proximate thereto being comprised by a transistor.

7. The method of claim 1 wherein the electrically insulative layer comprises silicon nitride.

8. The method of claim 1 wherein the electrically insulative layer consists essentially of silicon nitride.

9. The method of claim 1 wherein the electrically insulative layer consists of silicon nitride.

10. A method of forming a semiconductor construction, comprising:
    providing a semiconductor substrate having a memory array region and a peripheral region outside of the memory array region; the substrate having a first uppermost semiconductor surface within the memory array region, and having a second uppermost semiconductor surface within the peripheral region;
    forming paired transistors within the memory array region, the paired transistors being a first transistor and a second transistor, and comprising a first transistor gate and a second transistor gate, respectively; the first and second transistor gates being recessed into the first uppermost semiconductor surface; the first and second transistors having source/drain regions, and one of the source/drain regions being shared by the first and second transistors;
    forming a peripheral transistor gate over the peripheral region; the peripheral transistor gate being over the second uppermost semiconductor surface;
    forming an electrically insulative material extending over the paired transistors and over the peripheral transistor gate; and
    while protecting a segment of the electrically insulative material that is over the shared source/drain region with a patterned mask, anisotropically etching the electrically insulative material to form sidewall spacers along the peripheral transistor gate.

11. The method of claim 10 wherein the paired transistors together comprise three source/drain regions, with one of said three source/drain regions being the shared source/drain region and being between the first and second transistor gates, and with the other two of said three source/drain regions being on opposing sides of the first and second transistor gates from the shared source/drain region; wherein the patterning of the layer exposes said two other source/drain regions; and further comprising:
    forming a bitline in electrically connection with the shared source/drain region; and
    forming two capacitors in electrical connection with the two other source/drain regions.

12. The method of claim 11 wherein the capacitors are container capacitors.

13. The method of claim 12 wherein portions of the two capacitors are directly over portions of the protective block.

14. The method of claim 10 further comprising conductively-doping regions of the semiconductor substrate proximate the peripheral gate to form source/drain regions proximate the peripheral gate; the peripheral gate and source/drain regions proximate thereto being comprised by a peripheral transistor.

15. The method of claim 14 wherein at least some of the doping of the semiconductor substrate proximate the peripheral gate occurs prior to the formation of the electrically insulative layer.

16. The method of claim 10 wherein the electrically insulative layer comprises silicon nitride.

17. The method of claim 10 wherein the electrically insulative layer consists essentially of silicon nitride.

18. The method of claim 10 wherein the electrically insulative layer consists of silicon nitride.

* * * * *